(12) United States Patent
Maede et al.

(10) Patent No.: US 7,002,303 B2
(45) Date of Patent: Feb. 21, 2006

(54) ORGANIC EL PANEL DRIVE CIRCUIT AND ORGANIC EL DISPLAY DEVICE USING THE SAME DRIVE CIRCUIT

(75) Inventors: Jun Maede, Kyoto (JP); Shinichi Abe, Kyoto (JP); Akio Fujikawa, Kyoto (JP); Masanori Fujisawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 20 days.

(21) Appl. No.: 10/868,899

(22) Filed: Jun. 17, 2004

(65) Prior Publication Data

US 2004/0263086 A1    Dec. 30, 2004

(30) Foreign Application Priority Data

Jun. 27, 2003    (JP) .............................. 2003-184339

(51) Int. Cl.
G09G 3/10    (2006.01)
G09G 3/30    (2006.01)

(52) U.S. Cl. .............................. 315/169.3; 315/169.2; 315/169.1; 345/76; 345/92

(58) Field of Classification Search .................... None
See application file for complete search history.

(56) References Cited

U.S. PATENT DOCUMENTS

| | | | |
|---|---|---|---|
| 6,747,417 B1 * | 6/2004 | Meade et al. | 315/169.3 |
| 6,756,738 B1 * | 6/2004 | Maede et al. | 315/169.1 |
| 2003/0151374 A1 * | 8/2003 | Maede et al. | 315/169.3 |
| 2003/0151567 A1 * | 8/2003 | Hanada et al. | 345/76 |
| 2005/0067969 A1 * | 3/2005 | Maede et al. | 315/169.1 |

FOREIGN PATENT DOCUMENTS

| | | |
|---|---|---|
| JP | 9-232074 | 9/1997 |
| JP | 2001-143867 | 5/2001 |
| JP | 2003-255898 | 9/2003 |
| JP | 2003-308043 | 10/2003 |

* cited by examiner

Primary Examiner—Trinh V Dinh
Assistant Examiner—Binh Van Ho
(74) Attorney, Agent, or Firm—Mattingly, Stanger, Malur & Brundidge, P.C.

(57) ABSTRACT

Dummy circuits, which are not operated, are provided in transistor blocks, which are positioned in outermost side portions of a drive circuit forming area of an IC. Physical property-related stress of unit transistors constituting D/A converter circuits or the D/A converter circuits and output stage current sources, which are formed in the transistor block in an area between the outermost transistor blocks, are relatively even, so that current mirror circuits constituting the D/A converter circuits can be constructed with unit transistors having good pairing characteristics.

19 Claims, 4 Drawing Sheets

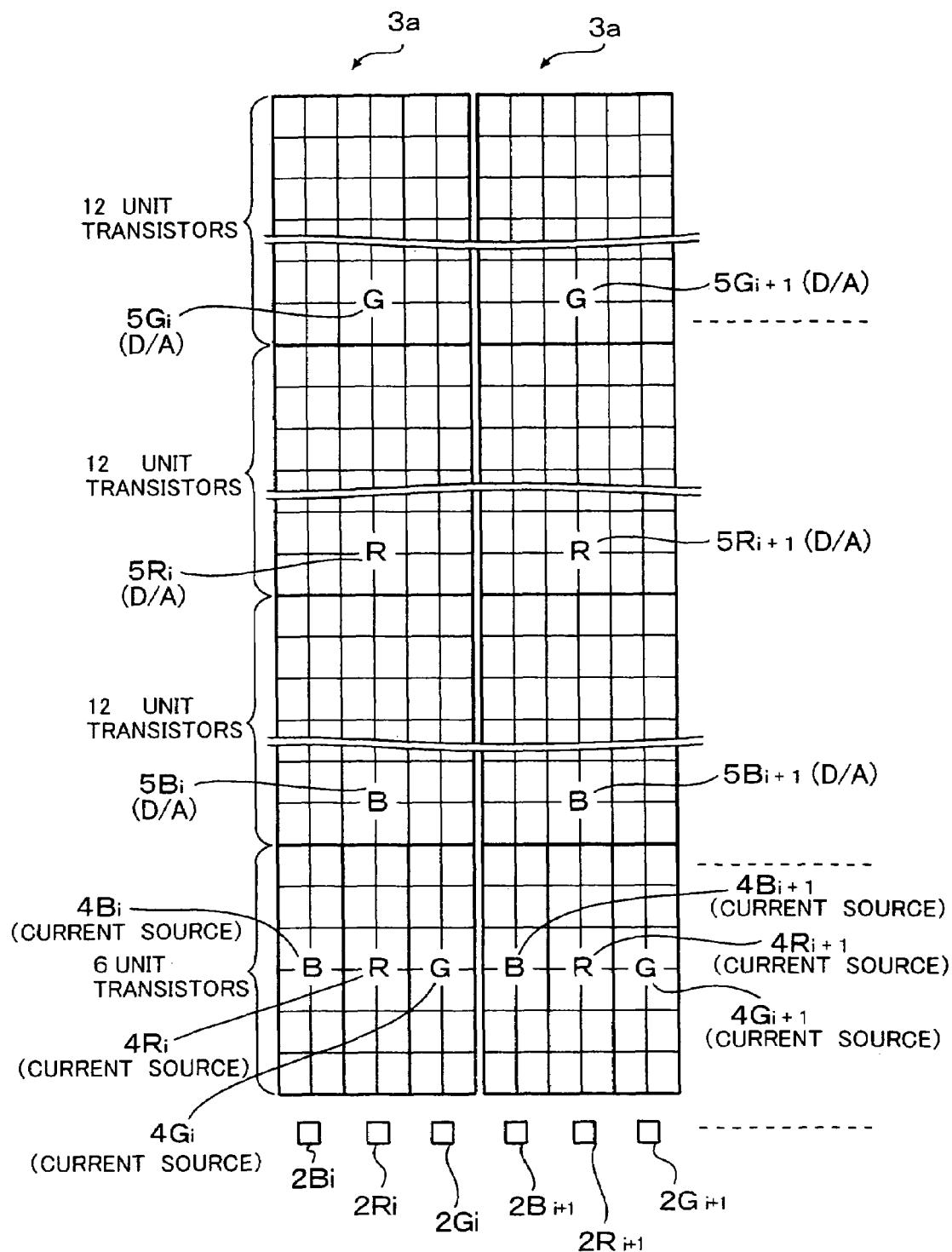

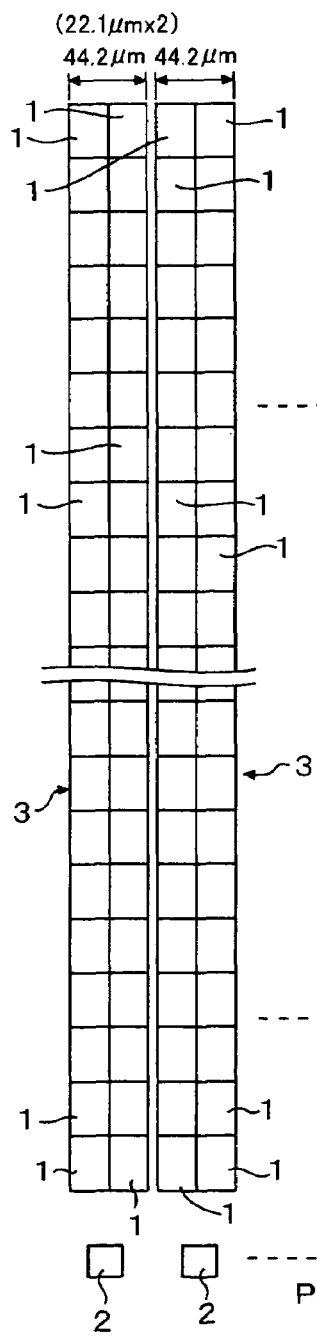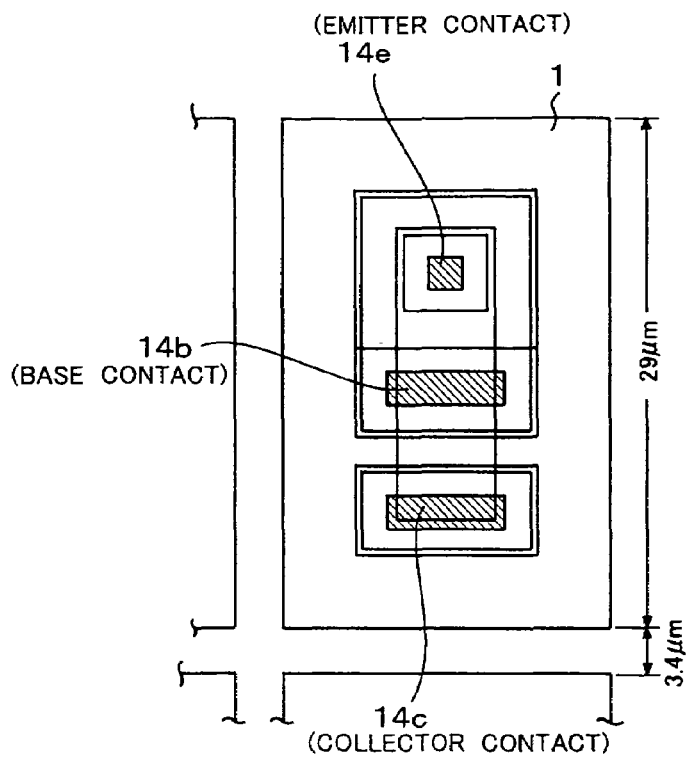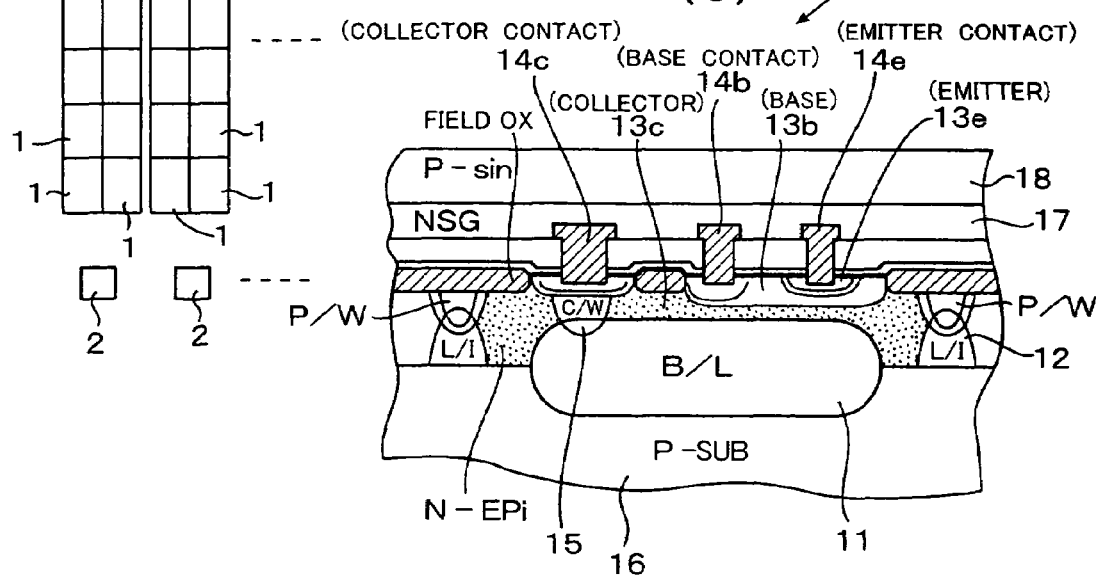

ORGANIC EL PANEL DRIVE CIRCUIT AND ORGANIC EL DISPLAY DEVICE USING THE SAME DRIVE CIRCUIT

BACKGROUND OF THE INVENTION

1. Field of the Invention

The present invention relates to an EL (electro luminescent) element drive circuit and an organic EL display device using the same drive circuit. In particular, the present invention relates to a circuit layout of a current drive circuit for driving organic EL elements having anodes connected to a column line of an organic EL panel of an organic EL display device through terminal pins of the organic EL panel by currents generated by a D/A converter circuit constituted with a current mirror circuit, with which luminous variation of the organic EL elements can be reduced to reduce influence thereof on luminous variation of every organic EL display device.

2. Description of the Prior Art

An organic EL display panel of an organic EL display device, which is mounted on a portable telephone set, a PHS, a DVD player or a PDA (personal digital assistance) and includes 396 (132×3) terminal pins for column lines and 162 terminal pins for row lines, has been proposed and the number of column lines and the number of row lines of such organic EL display panel tend to be further increased.

A current drive circuit of such organic EL display panel includes an input stage and an output stage. The output stage of the current drive circuit includes an output circuit constructed with a plurality of drive circuits, which are, for example, current-mirror circuits and are provided correspondingly to respective terminal pins of the organic EL display panel, regardless of the type of drive current, the passive matrix type or the active matrix type.

The output circuit constructed with the current mirror circuits, each of which is provided for each terminal pin and a drive stage of the output circuit includes parallel drive current mirror circuits constituting a reference current distributor circuit, which includes a plurality of output side transistors provided correspondingly to terminal pins of the organic EL panel, as disclosed in, for example, U.S. Pat. No. 6,586,888 corresponding to JP2003-255898A, which is hereby incorporated by reference. The current mirror circuits of the output circuit are responsive to a reference current supplied from a reference current generator circuit as an input stage of the current mirror circuit to generate mirror currents corresponding to the terminal pins to thereby drive the output circuit by distributing the mirror currents to the respective terminal pins. Further, D/A converter circuits having a current mirror construction are provided on an upstream side of the output circuit correspondingly to the respective terminal pins to D-A convert the mirror currents to thereby generate analog currents according to display data for the terminal pins. The analog currents thus generated drive the output circuit having the current mirror circuit construction to generate drive currents for the organic EL elements provided correspondingly to the terminal pins.

By generating the drive currents for the respective organic EL elements with using the current mirror circuit, it is possible to amplify the reference current, which is as small as several micro amperes in the passive matrix type, to about 1A with restricted power loss. Therefore, a drive circuit having low power consumption can be realized. In the active matrix type, it is possible to obtain the drive current in the order from 1 nA to 10 $\mu$A with low power consumption, similarly.

In such current drive circuit of the organic EL display panel, a number of unit transistors constituting the current mirror circuits are arranged for pads provided correspondingly to the respective terminal pins.

FIG. 4(a) to FIG. 4(c) show a conventional layout of unit transistors forming D/A converter circuits as output stage current sources of a current drive circuit and a construction of the unit transistor. In detail, FIG. 4(a) shows a layout of unit transistors, in which transistor blocks 3 each including two transistor columns each including a plurality of unit transistors 1 arranged perpendicularly to an arranging direction of pads 2 connected to respective output terminals of the organic EL display panel. A plurality of the transistor blocks 3 are arranged correspondingly to the respective pads 2. The current drive circuit provided as an IC for each output terminal of the organic EL display panel is constructed with a plurality of the transistor blocks 3.

As shown FIG. 4(c), which is a cross section of the unit transistor 1, the unit transistors 1 are isolated from each other in a rectangular region formed by a buried layer (B/L) 11 and element isolating region 12 and a base region 13b, an emitter region 13e and a collector region 13c of the unit transistor 1 are formed on a surface side of a substrate 16. Incidentally, reference numerals 14b, 14e and 14c shown in FIG. 4(b) and FIG. 4(c) depict a base contact, an emitter contact and a collector contact, respectively. The collector contact 14(c) is connected to the collector region 13c through a collector wall 15 and the buried layer 11.

A reference numeral 17 depicts an interlayer insulating film formed of NSG and a reference numeral 18 depicts an insulating layer formed of polysilicon (P-SiN) formed on the interlayer insulating film.

A pair of the transistor blocks 3, each of which includes a plurality of unit transistors 1 arranged perpendicularly to a pad arranging direction as a column, are provided for each pad as shown in FIG. 4(a). The current drive circuits provided correspondingly to the terminal pins of the organic EL display panel are constructed as an IC by integrating a plurality of paired transistor blocks 3 provided successively in the arranging direction of pads, which are provided correspondingly to output terminals of the current drive circuit.

Since one of the paired transistor blocks 3 corresponds to one of the R, G and B display colors, 3 pairs of the transistor blocks 3 are used as one set and a plurality of sets are provided for the pads successively.

When a pad pitch is, for example, 50 $\mu$m, and a width of an element forming area of the transistor block 3 in the pad arranging direction is 44 $\mu$m, 2 unit transistors are formed in parallel in the element forming area in the pad arranging direction with a gap of 6 $\mu$m between adjacent transistor blocks and an enough number of the transistor blocks 3 for constituting the drive circuits for the respective terminal pins in a direction perpendicular to the pad arranging direction.

As a result, the two unit transistor columns each including, for example, several tens to one hundred unit transistors 1, length of which is 1.0 mm to 3.0 mm, are arranged in the perpendicular direction correspondingly in position to each of the pads 2 to be connected to the output terminals. Almost all of these unit transistors 1 are current-mirror connected in a wiring layer above the insulating layer 18.

The current mirror output circuits constituting the output stage current source and the current switching D/A converter circuits constructed with current mirror circuits are constructed with paired transistors, which have substantially identical paring characteristics and selected from the paired unit transistors in the unit transistor columns.

In this description, the term "current switching D/A converter circuit" means a circuit for obtaining analog currents by ON/OFF switching currents of a plurality of current sources according to bit data.

The 2 columns of unit transistors 1 provided for each pad 2 are shown in FIG. 4(a). However, in order to improve the integrating efficiency, 6 columns of unit transistors for 3 terminal pins for R, G and B display colors may be used as one set corresponding to a pixel pitch of R, G and B display colors and a plurality of the sets are provided successively in row direction. In such case, although the width of the 6 columns of the unit transistors in the pad arranging direction becomes 150 μm, the wiring of the unit transistors is identical to that in the case of the 2 column set.

A drive circuit for driving organic El elements by current-driving organic EL elements arranged in a matrix and resetting the organic EL elements by grounding anodes and cathodes of the organic EL elements is disclosed in JPH9-232074A. Further, a technique for current driving organic EL elements with reduced power consumption by using a DC-DC converter is disclosed in JP2001-143867A.

In a case where large drive currents in the order of milli-ampere or ampere are generated on the basis of a reference current in the order of several micro amperes by the organic EL element drive circuit in which the drive currents are generated by using the D/A converter circuit having the current mirror circuit construction mentioned previously, there is a problem that variation of conversion accuracy of the D/A converter circuit causes variation of output current of an output stage current source, resulting in a luminous variation.

Particularly, in the current switching D/A converter having a current mirror construction, since the currents, which are, for example, twice, four times, eight times, sixteen times the reference current or more, obtained at the output side transistors of the current mirror circuit by switching the current from the current source, the number of the transistors constituting the current mirror circuit becomes several tens to one hundreds. Therefore, it is important to maintain the paring characteristics of unit transistors of the current mirror circuit with respect to the input side transistors thereof. In the IC chip, the pairing characteristics is influenced by distance between paired transistors and positions in the transistor block forming area of the IC, from which the paired transistors are selected.

Further, in order to generate the drive currents corresponding to the display data indicative of luminous intensities of the organic EL elements, the D/A converter circuit constructed with the current mirror circuit and having high conversion accuracy is required. When the vertically long unit transistor blocks 3 are arranged correspondingly to the pads, the pairing characteristics of unit transistors at opposite side positions of the transistor block forming area are degraded.

The reason for this is that, although a transistor block 3 positioned inside the transistor block forming area has other transistor blocks 3, each of which is similar to the inside transistor block 3 on both sides thereof, the transistor block provided at the end of the transistor block forming area has another transistor block on one side thereof. Therefore, the environments in physical properties of the transistor blocks 3 formed in the opposite side portions of the transistor block forming area are not equal or similar to those of the transistor blocks 3 formed inside the transistor block forming area so that there is a difference in characteristics between the transistor at either end portion of the transistor block forming are and the transistor formed inside the area.

Therefore, the pairing characteristics of these transistors forming the current mirror circuit is degraded.

As a result, the difference in output current between terminal pins corresponding to the current mirror circuits becomes large, resulting in variation of luminous intensity of the organic EL elements. Particularly, when a plurality of drive ICs are used, the luminous variation at boarder of the ICs becomes conspicuous.

In U.S. Pat. No. 6,586,888, the luminous variation in the boarder between ICs is prevented by arranging an input side transistor of a current mirror circuit for distributing a reference current in a center portion of a plurality (several tens) of output side transistors of the same current mirror circuit.

FIG. 5 shows output current characteristics of the current mirror circuit disclosed in U.S. Pat. No. 6,586,888. That is, FIG. 5 is a graph showing the inter-terminal output current characteristics of the current drive circuit with 45 terminal pins for each of R, G and B display colors. In FIG. 5, the ordinate axis indicates current variation rate (%) and the axis of abscissas indicates the terminal pin numbers corresponding to positions of the terminal pins. A thin sequential line shows measured inter-terminal output current characteristics and a thick line shows a regression curve.

As is clear from FIG. 5, the closer the terminal pin to either end portion of the transistor block forming area is, the smaller the output current is. The terminal pins at the opposite ends of the transistor block forming area correspond to the transistor groups 3 at the opposite end portions of the transistor group forming area in a substrate of the IC, respectively.

Even if the reference current is distributed by arranging the input side transistor of the current mirror circuit in the center portion of the output side transistors as disclosed in U.S. Pat. No. 6,586,888, it is impossible to sufficiently restrict the luminous variation on the display screen of the organic EL display panel. The luminous variation of every organic EL display device is strongly influenced by the reduction of output current of the transistors in the opposite end portions of the transistor block forming area.

SUMMARY OF THE INVENTION

An object of the present invention is to provide an organic EL drive circuit, which can reduce luminous variation on an organic EL display panel.

Another object of the present invention is to provide an organic EL display device using the same organic EL element drive circuit.

In order to achieve the above objects, an organic EL element drive circuit according to the present invention is featured by comprising a plurality of pads provided correspondingly to terminal pins of an organic EL display panel, a plurality of D/A converter circuits provided correspondingly to the respective pads for generating analog currents according to display data of luminous intensities of organic EL elements, and a plurality of transistor blocks each having a rectangular area in which at least 2 columns of unit transistors are formed, a width of the rectangular area in a pad arranging direction substantially corresponding to n times a pad pitch, where n is a positive integer, wherein unit transistors constituting the D/A converter circuits are selected from the unit transistors of the transistor blocks and the D/A converter circuits constructed with the unit transistors of the outermost transistor blocks are dummy circuits, which are inoperable for driving the organic EL elements arranged in a matrix.

The organic EL drive circuit may further comprise a plurality of current sources provided correspondingly to the pads. The current source is responsive to outputs of the output circuits of the D/A converters to generate drive currents and output the drive currents to the terminal pins through the pads. Unit transistors constituting the D/A converters and the current sources are selected from the transistor blocks and the D/A converters and the current sources constituted with transistors of the outermost transistor blocks are dummy circuits, which are not used to drive organic EL elements arranged in a matrix.

In the present invention, since the transistor blocks provided in opposite ends of the drive circuit forming area of the IC chip are the dummy circuits, the difference in physical property between the transistors, which are formed in the transistor blocks inside the transistor block forming area and forming the D/A converters or the D/A converters and the current sources, is reduced, so that the current mirror circuits of the D/A converters can be constructed with transistors having high pairing characteristics.

Therefore, the reduction of output currents to be supplied to the outermost terminal pins is restricted and the luminous variation of the organic EL elements corresponding to the terminal pins can be reduced. As such, the influence of the luminous variation on a luminous variation of every organic EL display device can be reduced.

BRIEF DESCRIPTION OF THE DRAWINGS

FIG. 3 is a plan view of the organic EL drive circuit when one transistor block is assigned to R, G and B display colors;

FIG. 4(a) is a plan view showing a conventional layout of unit transistors constituting a D/A converter circuit and an output stage current sources of a current drive circuit;

FIG. 4(b) is a plan view of a unit transistor used in the layout shown in FIG. 4(a);

FIG. 4(c) is a cross section of the unit transistor shown in FIG. 4(b); and

DETAILED DESCRIPTION OF THE PREFERRED EMBODIMENTS

Figure 1:
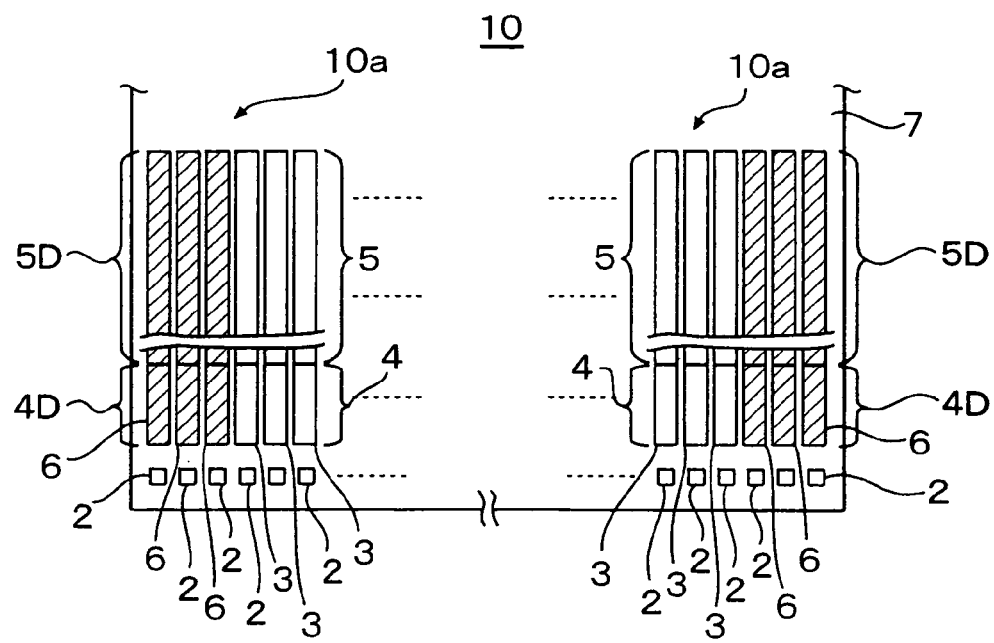
FIG. 1 shows a layout of unit transistors constituting current mirror circuits of a D/A converter circuit of a current drive circuit and output stage current sources thereof in a transistor block forming area of an IC, according to an embodiment of the present invention.

Constructive components shown in FIG. 1 and FIG. 3, which are the same as those shown in FIG. 4(a) to FIG. 4(c), are depicted by same reference numerals, respectively.

FIG. 1 shows a layout of unit transistor blocks formed in a transistor block forming area 7 of a column driver IC 10 of an organic EL drive circuit, according to an embodiment of the present invention. In FIG. 1, a reference numeral 10a depicts a layout of the unit transistor blocks each including unit transistors constituting a D/A converter circuit and an output stage current source, which are provided correspondingly to terminal pins of an organic EL display panel.

A transistor block 3 includes two columns each including 42 unit transistors similarly to the transistor block 3 shown in FIG. 4(a). Hatched transistor blocks 6 each similar to the transistor block 3 are dummy blocks forming dummy circuits, which are not used to drive organic EL elements arranged in a matrix.

A set of three transistor blocks 3 for R, G and B display colors provided correspondingly to respective pads 2, are arranged in the pad arranging direction (lateral direction on the drawing sheet) in the order with pad pitch and with predetermined gaps between the transistor blocks 3. Three transistor blocks 6 each having the same construction as the transistor block 3 are formed in each outermost area of the transistor block forming area 7 of the IC chip 10 as dummy transistor blocks, which are not connected to the corresponding pads 2 and not used.

The current drive circuit for the organic EL panel includes an input stage having a reference current generator circuit, a drive stage including a plurality of transistors and an output stage. The drive stage and the output stage are provided correspondingly to each of the terminal pins of the organic EL panel. The current drive circuits are formed in the transistor blocks 3. The drive stage of the current drive circuit includes a reference current distributor circuit for distributing the reference currents to the respective terminal pins and current switching D/A converters each having a current mirror circuit. The current switching D/A converters are provided correspondingly to the respective terminal pins. The current switch D/A converter circuits respond to the display data to drive the output stage current sources provided correspondingly to the terminal pins.

In this embodiment, a transistor block portion 4 of each transistor block 3 is constituted with 2×6 unit transistors, which constitute the output stage current source, and a transistor block portion 5 of each transistor block 3 is constructed with 2×36 unit transistors, which constitute the current switching D/A converter circuit.

On the other hand, the transistor blocks 4D and 5D of the three transistor blocks 6 formed in each end portions of the transistor block forming area 7 are dummy blocks, in which the output stage current sources and the current switching D/A converter circuits are also formed although these circuits are not used. Therefore, there is no wiring formed for connecting the dummy block portions 4D and 5D to the respective pads 2 or to the terminal pins.

Figure 2:
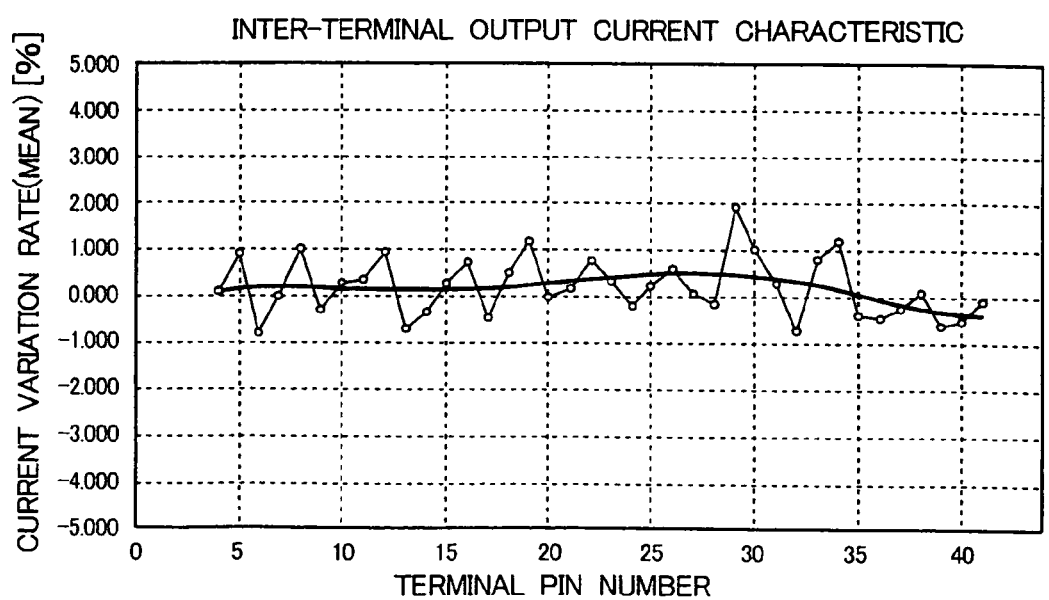
FIG. 2 is a graph showing an inter-terminal output current characteristics of transistors formed in the transistor block forming area of the IC.

In this case, the circuit disclosed in U.S. Pat. No. 6,586,888 is realized by using 10 unit transistors for the current mirror circuit constituting the output stage current sources and 70 unit transistors for the current mirror circuits constituting the switching D/A converter circuits and adding 2 dummy transistors to each of the output stage current mirror circuit and the current switching D/A converter. FIG. 2 is a graph showing the output current characteristics for the terminal pins in such case.

Details of the output stage current source and the D/A converter circuit formed in the transistor blocks 3 and 6 are disclosed in U.S. patent application Ser. No. 10/360,714 (corresponding to JP2003-308043A) which is hereby incorporated by reference.

Figure 5:
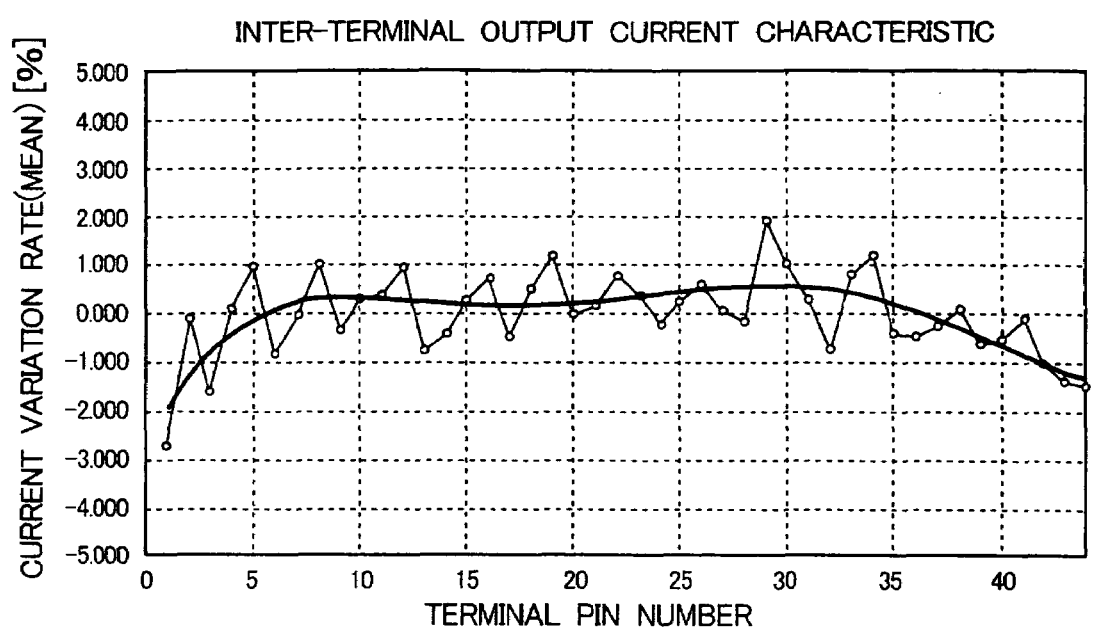
FIG. 5 is a graph showing an inter-terminal output current characteristics of the layout shown in FIG. 4(a).

As shown in FIG. 2 showing the inter-terminal output current characteristics, in which the ordinate axis indicates current variation rate (%) and the axis of abscissas indicates the terminal pin numbers corresponding to positions of the pads 2 corresponding to the terminal pins of the organic EL display panel, a thin sequential line is measured current variation rate and a thick line shows a regression curve, the inter-terminal current characteristics is flat compared with that shown in FIG. 5 and variation of output currents between terminal pins is reduced, although the number of terminal pins for each of R, G and B display colors is reduced by 2.

FIG. 3 shows a layout of unit transistors constituting an organic EL drive circuit of an organic EL panel according to another embodiment of the present invention. In FIG. 3, unlike the embodiment shown in FIG. 1, in which three transistor blocks are assigned to R, G and B display colors, respectively, transistor blocks 3a each including output stage current sources for B, R and G display colors, which are arranged in the order in the arranging direction of the pads and D/A converter circuits for B, R and G colors, which are arranged in the order perpendicularly to the pad arranging direction.

That is, the transistor block 3a is constructed with 3 transistor blocks 3 each including 2 columns of unit transistors. Although not shown in FIG. 3, the transistor block 3a forming the dummy circuits corresponding to the transistor block 6 shown in FIG. 1 is provided in each of the opposite side portions of the transistor block forming area 7 outside the drive circuit IC forming area.

In FIG. 3, the current sources 4Ri, 4Gi and 4Bi, . . . forming the output stages of each transistor block 3a are arranged along the arranging direction of pads 2Bi, 2Ri and 2Gi, . . .

Portions 5Ri, 5Gi and 5Bi of the transistor block 3a are D/A converter circuits in the transistor forming block 7 and are provided perpendicularly to the arranging direction of the pads 2Bi, 2Ri, 2Gi, . . .

Incidentally, the transistor blocks having the dummy circuit 4D, in which output stage current sources 4Ri, 4Gi and 4Bi are formed, and the dummy circuit 5D, in which D/A converter circuits 5Ri, 5Gi and 5Bi are formed, are provided in the outermost side portions of the transistor block forming area 7 of the IC chip.

Similarly to the layout shown in FIG. 1, the transistor block 3a includes 84×3 unit transistors for the output stage current sources and the D/A converter circuits for R, G and B display colors. Therefore, a total number of the unit transistors in the transistor block 3a is 252.

In the embodiment shown in FIG. 3, the current mirror circuits are formed by selecting unit transistors 1 constituting the current mirror circuits for R, G and B display colors from the transistor block 3a with pad pitch, which is 3 times the pad pitch shown in FIG. 1 and assigning the selected unit transistors 1 to the output stage current sources and the D/A converter circuits for R, G and B display colors.

Incidentally, in the embodiment shown in FIG. 3, the transistor block 3a including the D/A converter circuits is formed in the rectangular area having wide width in the pad arranging direction, so that a range of area from which the transistors having good pairing characteristics are selected is enlarged in the pad arranging direction. Although the pairing characteristics shown in FIG. 5 is obtained by selecting transistors to be paired from transistors arranged perpendicularly to the pad arranging direction, the probability of obtaining good pairing characteristics becomes higher than the case shown in FIG. 5, according to the embodiment shown in FIG. 3.

Besides, icons for indicating the receiving state of radio wave and residual power of a battery, etc., in a portable telephone set or the like are provided in an upper portion of a display screen thereof. Further, there are many other devices in which icons corresponding to specific operations are provided in a lower portion of a display screen thereof.

Setting aside the color display without luminous variation, some luminous variation of color display of such icons can be accepted because such icon display is independent from the display by the main organic EL elements arranged in a matrix, according to display data at every moment. Further, since the pixel of such icon is large, the display of icon requires relatively large drive current.

Therefore, the output stage current source of the transistor block 4D of the transistor block 6 of the dummy circuit shown in FIG. 1 drives the organic EL elements corresponding to the icon through the pads 2. The organic EL elements for displaying the icon is driven by connecting the output stage current sources of the dummy circuit to icon driving terminal pins of the organic EL panel. Since variation of drive currents in the case of icon display is not important, it is possible to effectively use the dummy circuits.

Since the dummy circuit 6 is supplied with power from the power source line of the organic EL panel, the dummy circuit does not influence on the variation of drive currents supplied to the terminal pins corresponding to the main organic EL elements, regardless of whether the dummy circuits are operated for icon display or are not operated at all. That is, it is enough in the present invention that the dummy circuit does not drive the main organic EL elements arranged in a matrix.

Incidentally, since the drive current for driving the organic EL elements for icon display is large, it is preferable that a plurality of current sources in the blocks 4D of the transistor block 6 are connected to organic EL elements for one icon to drive the latter elements in parallel. In such case, it is easily possible to obtain large drive currents.

As described hereinbefore, in the embodiments of the present invention, a current source and at least one D/A converter circuit are provided in each of the transistor blocks 3 and 6. In the active type organic EL panel, the drive current is small and, therefore, the output of the D/A converter circuit can be used directly as the drive current. In such case, the D/A converter becomes the output stage drive current source. In the layout of unit transistors in such case, the block 4 or 4D, in which the output stage current sources are formed as shown in FIG. 1 and FIG. 3, can be deleted and the block 5 or 5D, in which the D/A converter circuits are formed, are made correspondent to the pads 2.

Therefore, in the present invention, only the D/A converter circuits may be provided in the transistor blocks 3 and 6.

Further, in the described embodiments, the pad 2 is provided for the transistor block 6 including the dummy circuit. In a case where the dummy circuit is not used to drive the organic EL elements, etc., for icon display, the pad for the transistor block 6 can be deleted since there is no need of providing a wiring to the pad 2.

Further, in the described embodiments, the dummy circuits are assigned to the transistor blocks in the outermost side portions of the drive circuit forming area in the IC chip. Therefore, it is of course possible to form circuits other than the drive circuits of the organic EL elements in the outermost side portions of the drive circuit forming area. At least one dummy transistor block can be formed in each of the side portions.

Further, the present invention can be applied to not only the passive type organic EL panel, in which organic EL elements connected directly to the column line are current-driven, but also the active matrix type organic EL panel, in which the organic EL elements of a pixel circuit are driven through capacitors of the pixel circuits.

In the described embodiments, although bipolar transistor is used as the unit transistor, the organic EL element drive circuit according to the present invention can be constructed with MOSFETs instead of the bipolar transistors.

What is claimed is:

1. An organic EL panel drive circuit as an IC for current-driving an organic EL elements through terminal pins of an organic EL display panel, comprising:
   a plurality of pads provided correspondingly to said terminal pins;
   a plurality of D/A converter circuits having current-mirror circuits constructed with unit transistors and provided correspondingly to said pads, respectively, said D/A converter circuits adapted to generate analog currents corresponding to display data for luminous display of said organic EL elements; and
   a plurality of transistor blocks each having a rectangular area in which at least two columns of unit transistors are formed, a width of the rectangular area in a pad arranging direction substantially corresponding to n times a pad pitch, where n is a positive integer,
   wherein unit transistors constituting the D/A converter circuits are selected from the unit transistors of the transistor blocks and the D/A converter circuits constructed with the unit transistors of the outermost transistor blocks are dummy circuits, which are inoperable for driving the organic EL elements arranged in a matrix.

2. The organic EL panel drive circuit as claimed in claim 1, wherein said plurality of transistor blocks are arranged correspondingly to one or more of pads, said at least two columns of unit transistors include at least two unit transistors arranged in the said pad arranging direction and a plurality of unit transistors are arranged in a direction perpendicular to said pad arranging direction and the dummy circuits are positioned in outermost side portions of a forming area of the plurality of transistor blocks.

3. An organic EL panel drive circuit as an IC for current-driving an organic EL elements through terminal pins of an organic EL display panel, comprising:
   a plurality of pads provided correspondingly to said terminal pins;
   a plurality of D/A converter circuits having current-mirror circuits constructed with unit transistors and provided correspondingly to said pads, respectively, said D/A converter circuits adapted to generate analog currents corresponding to display data for luminous display of said organic EL elements; and
   a transistor arranging block including a plurality of transistor blocks each having a rectangular area and width in an arranging direction of said pads and arranged with pitch, which is substantially n times an arranging pitch of said pads, where n is a positive integer, each said transistor block including at least two columns of unit transistors including at least two unit transistors arranged in the width direction of said transistor arranging block and a plurality of unit transistors arranged in a direction perpendicular to said pad arranging direction, said unit transistors constituting said D/A converter circuits being selected from an inside area of said transistor arranging block, said D/A converter circuits constructed with unit transistors formed in outermost side areas of said transistor arranging block in said direction perpendicular to said pad arranging direction being dummy circuits, which are inoperable for driving the organic EL elements arranged in a matrix.

4. The organic EL panel drive circuit as claimed in claim 3, wherein said D/A converter circuit is a current switching D/A converter circuit.

5. The organic EL panel drive circuit as claimed in claim 4, further comprising a plurality of current sources provided correspondingly to said pads for current-driving said organic EL elements, wherein said current sources are driven by output currents from said D/A converter circuits provided correspondingly to said pads, unit transistors constituting said current sources are selected from the inside area of said transistor arranging block and said dummy circuits include current sources constituted with unit transistors in the outermost side areas of said transistor arranging block.

6. The organic EL drive circuit as claimed in claim 5, wherein said current sources have current mirror circuits, respectively.

7. The organic EL panel drive circuit as claimed in claim 5, wherein each said dummy circuit includes a plurality of said transistor blocks and wherein said pads corresponding to the plurality of said transistor blocks are absent, circuit connections to said pads are absent or connections from said pads to said terminal pins for driving said organic EL elements are absent.

8. The organic EL panel drive circuit as claimed in claim 5, wherein said D/A converter circuits and said current sources are provided for R, G and B display colors, respectively, said transistor blocks for R, G and B display colors are repeated sequentially, a plurality of said transistor blocks for said dummy circuits are provided and said current sources are output stage current sources constituted as current mirror circuits.

9. The organic EL panel drive circuit as claimed in claim 5, wherein n is 3, said transistor block includes at least 6 unit transistors arranged in said pad arranging direction with pitch, which is 3 times the pad pitch, and said D/A converter circuits and said current sources are provided correspondingly to R, G and B display colors.

10. The organic EL panel drive circuit as claimed in claim 5, wherein said current sources of said dummy circuits are connected to said terminal pins of said organic EL panel for icon display.

11. The organic EL panel drive circuit as claimed in claim 10, wherein said dummy circuit includes a plurality of said transistor blocks and the plurality of said current sources are connected in parallel to said terminal pins of said organic EL panel for icon display.

12. The organic EL panel display device as claimed in claim 8, wherein a plurality of said current sources among said current sources of said dummy circuits corresponding to R, G and B display colors are connected in parallel to said terminal pins of said organic EL panel for icon display.

13. An organic EL display device including an organic EL drive circuit formed as an IC for current-driving organic EL elements through terminal pins of an organic EL display panel, said IC comprising:
   a plurality of pads provided correspondingly to said terminal pins;
   a plurality of D/A converter circuits having current-mirror circuits constructed with unit transistors and provided correspondingly to said pads, respectively, said D/A converter circuits adapted to generate analog currents corresponding to display data for luminous display of said organic EL elements; and
   a plurality of transistor blocks each having a rectangular area in which at least two columns of unit transistors are formed, a width of the rectangular area in a pad arranging direction substantially corresponding to n times a pad pitch, where n is a positive integer,
   wherein unit transistors constituting the D/A converter circuits are selected from the unit transistors of the transistor blocks and the D/A converter circuits constructed with the outermost transistor blocks are dummy circuits, which are inoperable for driving the organic EL elements arranged in a matrix.

14. An organic EL display device including an organic EL drive circuit formed as an IC for current-driving organic EL elements through terminal pins of an organic EL display panel, said IC comprising:
a plurality of pads provided correspondingly to said terminal pins;
a plurality of D/A converter circuits having current-mirror circuits constructed with unit transistors and provided correspondingly to said pads, respectively, said D/A converter circuits adapted to generate analog currents corresponding to display data for luminous display of said organic EL elements; and
a transistor arranging block including a plurality of transistor blocks each having a rectangular area having width in an arranging direction of said pads and arranged with pitch, which is substantially n times the arranging pitch of said pads, where n is a positive integer, each said transistor block including at least two columns of unit transistors including at least two unit transistors arranged in the width direction of said transistor arranging block and a plurality of unit transistors arranged in a direction perpendicular to said pad arranging direction, said unit transistors constituting said D/A converter circuits being selected from an inside area of said transistor arranging block, said D/A converter circuits constructed with unit transistors formed in outermost side areas of said transistor arranging block in said direction perpendicular to said pad arranging direction being dummy circuits, which are inoperable for driving the organic EL elements arranged in a matrix.

15. The organic EL display device as claimed in claim 14, wherein said D/A converter circuit is a current switching D/A converter circuit.

16. The organic EL display device as claimed in claim 15, further comprising a plurality of current sources provided correspondingly to said pads for current-driving said organic EL elements, wherein said current sources are driven by output currents from said D/A converter circuits provided correspondingly to said pads, unit transistors constituting said current sources are selected from the inside area of said transistor arranging block and said dummy circuits include current sources constituted with unit transistors in the outermost side areas of said transistor arranging block.

17. The organic EL display device as claimed in claim 16, wherein said current sources have current mirror circuits, respectively.

18. The organic EL display device as claimed in claim 16, wherein each-said dummy circuit includes a plurality of said transistor blocks and wherein said pads corresponding to the plurality of said transistor blocks are absent, circuit connections to said pads are absent or connections from said pads to said terminal pins for driving said organic EL elements are absent.

19. The organic EL display device as claimed in claim 16, wherein said D/A converter circuits and said current sources are provided for R, G and B display colors, respectively, said transistor blocks for R, G and B display colors are repeated sequentially, a plurality of said transistor blocks for said dummy circuits are provided and said current sources are output stage current sources constituted as current mirror circuits.

* * * * *